United States Patent
Ji et al.

(10) Patent No.: US 11,538,515 B2
(45) Date of Patent: Dec. 27, 2022

(54) DRAM MEMORY

(71) Applicant: ChangXin Memory Technologies, Inc., Hefei (CN)

(72) Inventors: Kangling Ji, Hefei (CN); Weibing Shang, Hefei (CN); Hongwen Li, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 0 days.

(21) Appl. No.: 17/281,206

(22) PCT Filed: Dec. 24, 2019

(86) PCT No.: PCT/CN2019/127862
§ 371 (c)(1),
(2) Date: Mar. 29, 2021

(87) PCT Pub. No.: WO2021/056887
PCT Pub. Date: Apr. 1, 2021

(65) Prior Publication Data
US 2022/0093159 A1    Mar. 24, 2022

(30) Foreign Application Priority Data

Sep. 24, 2019   (CN) .......................... 201910904496.8

(51) Int. Cl.
*G11C 8/00* (2006.01)
*G11C 11/408* (2006.01)
*G11C 11/403* (2006.01)

(52) U.S. Cl.
CPC ........ *G11C 11/4087* (2013.01); *G11C 11/403* (2013.01)

(58) Field of Classification Search
CPC .......................... G11C 11/4087; G11C 11/403
(Continued)

(56) References Cited

U.S. PATENT DOCUMENTS

| 5,914,907 A | 6/1999 | Kobayashi et al. |
| 5,943,285 A | 8/1999 | Kohno |

(Continued)

FOREIGN PATENT DOCUMENTS

| WO | WO 03/085672 | * 10/2003 |
| WO | WO 2021/056887 A1 | 4/2019 |

OTHER PUBLICATIONS

PCT/CN2019/127863 International Search Report dated Jun. 23, 2020, with English Translation.

*Primary Examiner* — Huan Hoang
(74) *Attorney, Agent, or Firm* — Alston & Bird LLP

(57) ABSTRACT

A DRAM memory includes: a substrate; a plurality of memory banks arranged in rows and columns on the substrate, each memory bank is divided into three memory blocks in the column direction. Each memory block has a number of memory cells arranged in rows and columns. Dividing each memory bank into three memory blocks in the column direction shortens the length of the memory bank in the row direction, as each memory bank has a certain capacity, so a large drive is no longer required. In addition, the distance from the control circuit and the data transmission circuit to the corresponding memory cell in the memory array in each memory bank will be shorter too, reducing parasitic resistance and parasitic capacitance generated from the data transmission circuit. As a result, the data transmission rate and data transmission accuracy are improved. The overall power consumption is reduced.

8 Claims, 2 Drawing Sheets

(58) Field of Classification Search
USPC .................................................. 365/230.06
See application file for complete search history.

(56) References Cited

U.S. PATENT DOCUMENTS

| | | | |
|---|---|---|---|
| 6,069,812 A | 5/2000 | Lee et al. | |
| 6,121,677 A | 9/2000 | Song et al. | |
| 6,329,678 B1 | 12/2001 | Jung | |
| 6,448,602 B1 | 9/2002 | Sakashita et al. | |
| 2009/0097348 A1* | 4/2009 | Minzoni | G11C 11/4097 |
| | | | 365/230.03 |

* cited by examiner

DRAM MEMORY

CROSS REFERENCES TO RELATED APPLICATIONS

This application is a national phase entry of International Application No. PCT CN2019/127862 filed on Dec. 24, 2019, which claims the benefit of priority to CN Patent Application CN 201910904496.8 filed on Sep. 24, 2019, both entitled "A DRAM MEMORY", the contents of which are incorporated herein by reference in its entirety.

TECHNICAL FIELD

The present invention relates to the field of memory device, in particular to a DRAM memory device.

BACKGROUND

Dynamic Random Access Memory (Dynamic Random Access Memory, DRAM) is a commonly used semiconductor memory device in computers, and its memory array area is composed of many repeated memory cells. Each memory cell usually includes a capacitor and a transistor. The gate of the transistor is connected to the word line, the drain is connected to the bit line, and the source is connected to the capacitor. The voltage signal on the word line can control the opening or closing of the transistor, and then read the data information stored in the capacitor through the bit line, or write the data information into the capacitor for memory through the bit line.

The existing DRAM memory organization structure includes a number of banks (BANK), each bank (BANK) is divided into two memory blocks of the same size. However, the existing organizational structure of DRAM memory has problems such as high power consumption and room for improvements in data transmission rate and data transmission accuracy.

BRIEF SUMMARY

The technical problem to be solved by the present invention is how to reduce the power consumption of the DRAM memory and how to improve the data transmission rate and data transmission accuracy.

The present disclosure provides a DRAM memory, including: a substrate, a number of memory banks arranged in rows and columns on the substrate, wherein each memory bank is divided into three memory blocks in the column direction, and each memory block has a number of memory cells arranged in rows and columns.

Optionally, the three memory blocks include a first memory block, a second memory block, and a third memory block that are sequentially arranged in a column direction.

Optionally, the first memory block, the second memory block, and the third memory block in each memory bank are respectively connected to a first column decoding circuit, a second column decoding circuit, and a third column decoding circuit.

Optionally, the first memory block, the second memory block, and the third memory block in each memory bank are further connected to a first row decoding circuit and a second row decoding circuit.

Optionally, the first row decoding circuit is connected to all the memory cells in the first memory block and some memory cells in the second memory block, and is configured to determine row address in all memory cells in the first memory block and some memory cells in the second memory block. The second row decoding circuit is connected to all memory cells in the third memory block and some memory cells in the second memory block, and is used to perform row addressing to all memory cells in the third memory block and some memory cells in the second memory block.

Optionally, the first memory block, the second memory block, and the third memory block have the same memory capacities.

Optionally, there is an circuit area between the memory banks in two adjacent columns, the circuit area has a control circuit and a data transmission circuit, and the control circuit is used to send control instructions and/or addresses to the corresponding memory banks, so the data transmission circuit is used to transmit data to or read data from the corresponding memory cells in the corresponding memory banks, or read data from the corresponding memory cell in the corresponding memory banks.

Optionally, the substrate further has a pad area, the pad area has a plurality of first pads and second pads, the first pads are connected to the control circuit, and the second pads are connected with the data transmission circuit.

Compared with the existing techniques, the present invention has the following advantages:

The DRAM memory of the present invention includes: a substrate; a plurality of memory banks arranged in rows and columns on the substrate, each memory bank is divided into three memory blocks in the column direction, and each memory block includes several memory cells arranged in rows and columns. First, dividing each memory bank into three memory blocks in the column direction, and the length of each memory block in the row direction will be shorter (compared to the scheme of dividing each memory bank into two memory blocks in the row direction), so that the length of the control circuit itself will be shorter, and the distance from the control circuit to a corresponding memory cell in the memory array of each memory block will be shorter too, therefore it does not require a large drive, reducing power consumption. In addition, it shortens the length of the data transmission circuit itself, because the distance from the data transmission circuit to the corresponding memory cell in the memory array of each memory block, thereby reducing the parasitic resistance and capacitance generated by the data transmission circuit, and improving the data transmission rate and data transmission accuracy, as well as reducing power consumption. In addition, shortening the length of the memory blocks in the memory banks can optimize the memory bank layout in the DRAM memory, and optimize the length to width ratio of the DRAM memory, which is beneficial to later packaging.

Further, the first memory block, the second memory block, and the third memory block in each memory bank respectively connect to a first column decoding circuit, a second column decoding circuit, and a third column decoding circuit. The first memory block, the second memory block and the third memory block in each memory bank also connect to the first row decoding circuit and the second row decoding circuit. The first column decoding circuit, the second column decoding circuit, and the third column decoding circuit are used to perform column addressing on corresponding memory cells in the first memory block, the second memory block and the third memory block respectively. A first row decoding circuit and a second row decoding circuit performs row-addressing to corresponding memory units of the first memory block, the second memory block, and the third memory block. Therefore it is possible to simultaneously access the corresponding memory cells in the three memory blocks of the memory bank (including reading, writing or refreshing), thereby improved the operation efficiency of the DRAM memory.

In an embodiment, the first row decoding circuit is connected to all the memory cells in the first memory block and some memory cells in the second memory block, and is used to perform row addressing to all memory cells in the first memory block and some memory cells in the second memory block. The second row decoding circuit is connected to all memory cells in the third memory block and some memory cells in the second memory block, and is used to perform row-addressing for all memory cells in the third memory block and some memory cells in the second memory block. Therefore, the row decoding of the memory cells in the three memory blocks in one memory bank can share their control, saving the area of the chip.

BRIEF DESCRIPTION OF THE DRAWINGS

By describing its exemplary embodiments in detail with reference to the accompanying drawings, the above and other objectives, features and advantages of the present disclosure will become more apparent.

DETAILED DESCRIPTION OF THE PREFERRED EMBODIMENTS

Figure 1:
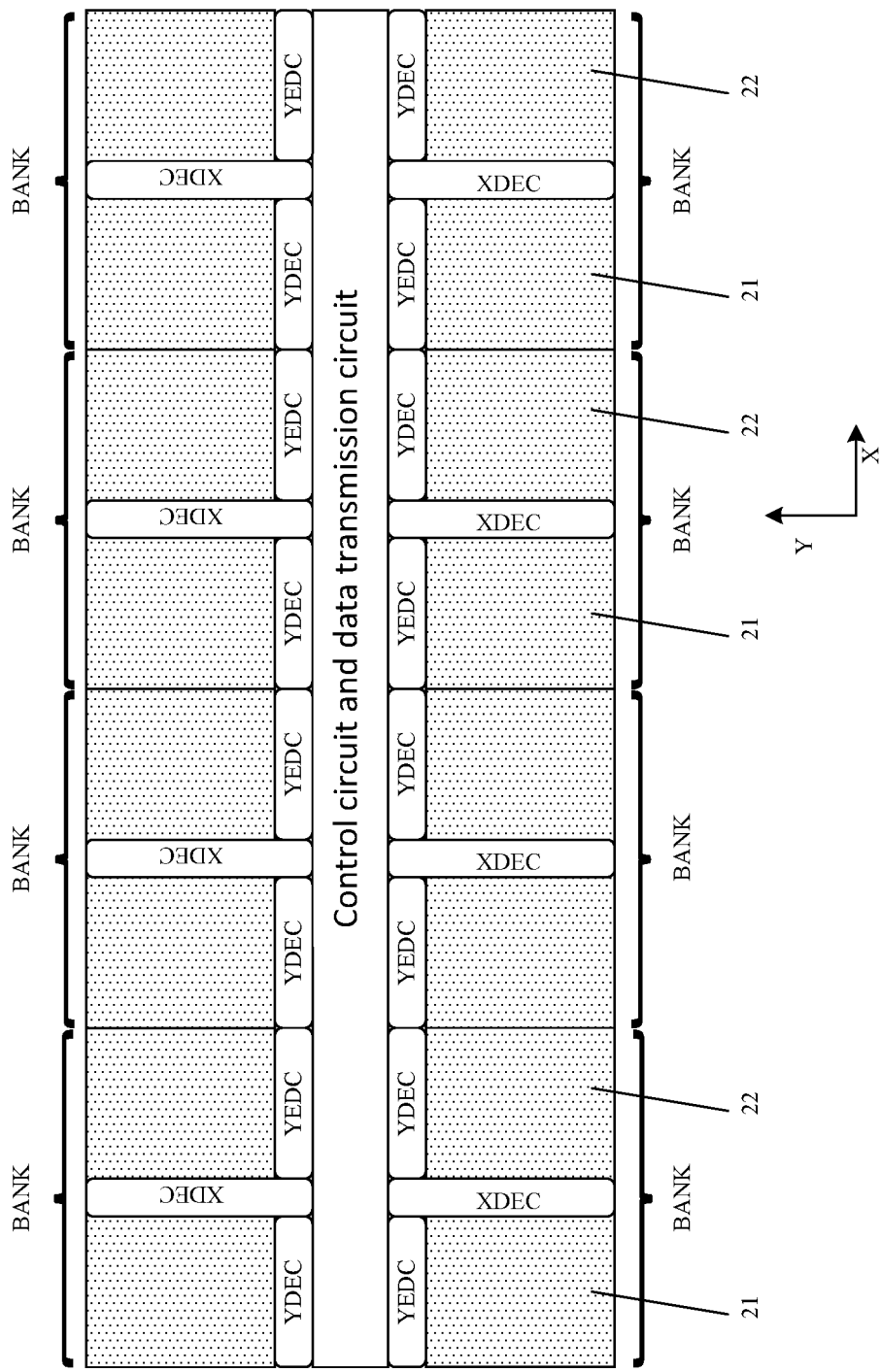
FIG. 1 is a schematic structural diagram of a DRAM memory according to an embodiment of the present invention.

Implementations of the present disclosure are illustrated below through specific embodiments. Those skilled in the art can easily understand other advantages and efficacy of the present disclosure according to the content disclosed in this specification. The present disclosure can also be implemented or applied through other different specific implementations. Various modifications or variations can also be made on details in this specification based on different opinions and applications without departing from the spirit of the present disclosure.

It should be noted that, the figures provided in this embodiment merely illustrate the basic conception of the present disclosure schematically. Therefore, the figures only show components related to the present disclosure, and are not drawn according to the quantity, shapes and sizes of components during actual implementation. The pattern, quantity and ratio of components during actual implementation can be changed arbitrarily, and the component layout may also be more complex.

The present disclosure effectively overcomes various disadvantages in the prior arts and hence has high industrial usage value. The foregoing embodiments only illustrate the principle and efficacy of the present disclosure exemplarily, and are not meant to limit variations of the technique. Any person skilled in the art can make modifications on the foregoing embodiments without departing from the spirit and scope of the present disclosure. Accordingly, all equivalent modifications or variations completed by those with ordinary skill in the art without departing from the spirit and technical thinking disclosed by the present disclosure should fall within the scope of claims of the present disclosure.

Example embodiments will now be described more fully with reference to the accompanying drawings. However, the example embodiments can be implemented in various forms, and should not be construed as being limited to the examples set forth herein; on the contrary, the provision of these embodiments makes the present disclosure more comprehensive and complete, and fully conveys the concept of the example embodiments To those skilled in the art. The drawings are only schematic illustrations of the present disclosure and are not necessarily drawn to scale. The same reference numerals in the figures denote the same or similar parts, and thus their repeated description will be omitted.

Furthermore, the described features, structures or characteristics can be combined in one or more embodiments in any suitable manner. In the following description, many specific details are provided to give a sufficient understanding of the embodiments of the present disclosure. However, those skilled in the art will realize that the technical solutions of the present disclosure can be practiced without one or more of the specific details, or other methods, components, devices, steps, etc. can be used. In other cases, well-known structures, methods, devices, implementations, or operations are not shown or described in detail to avoid overwhelming attention and obscure all aspects of the present disclosure.

In addition, the terms "first" and "second" are only used for descriptive purposes, and cannot be understood as indicating or implying relative importance or implicitly indicating the number of indicated technical features. Thus, the features defined with "first" and "second" may explicitly or implicitly include one or more of these features.

As mentioned in the background, the existing structure of a DRAM memory has the issues of high power consumption and need-to-improve data transmission rate and data transmission accuracy during operation.

FIG. 1 is a schematic structural diagram of a DRAM memory according to an embodiment of the present invention. The DRAM memory includes a number of rows and columns (the row direction is along the X axis in FIG. 1, and the column direction is along the Y axis in FIG. 1). In FIG. 1, 8 memory banks BANK are taken as an example for illustration. Each memory bank BANK is divided into two memory blocks of the same size one on the left and one on the right, including a first memory block 21 and a second memory block 22, The first memory block 21 and the second memory block 22 include a memory array or a number of memory cells arranged in rows and columns. The first memory block 21 and the second memory block 22 are respectively connected to the corresponding row decoding circuit YDEC and column decoding circuit XDEC. A control circuit and a data transmission circuit are provided between the memory banks, separating edge rows from adjacent memory banks, and the control circuit is used to transmit control signals to the corresponding bank BANK, and the data transmission circuit is used to transmit data to the corresponding memory cell. The aforementioned structural DRAM memory has a longer length in the row direction (X-axis direction) than the column direction, and the corresponding control circuit and data transmission circuit have a longer length in row direction too, and so the distance from the control circuit and the data transmission circuit to each memory cell is also long, thus increasing the power consumption, raising the parasitic resistance and capacitance generated by the control circuit and the data transmission circuit, thereby reducing the data transmission rate and data transmission accuracy. In addition, the long length in the row direction (X-axis direction) makes the aspect ratio of length to width not optimized, which affects packaging directly and may fail to meet packaging requirements.

Thus, the present invention provides a DRAM memory, including: a substrate; a plurality of memory banks arranged in rows and columns on the substrate, each memory bank is divided into three memory blocks in the column direction. Each memory block has a number of memory cells arranged in rows and columns. First, as the capacity of each memory bank BANK is constant, by dividing each memory bank BANK into three memory blocks (the first memory block 31, the second memory block 32 and the third memory block 33) in the column direction, the length of each memory block in the row direction will be shortened (comparing to dividing each memory bank into two memory blocks in the row direction), the length of the control circuit itself will be shortened, and the distance from the control circuit to the corresponding memory cell in the memory array in each memory block will be shortened, so that a large drive will not be required, therefore power consumption is reduced. The length of the data transmission circuit itself is also shortened, and the distance from the data transmission circuit to the corresponding memory cell in the memory array in each memory block will be shortened too, so that the parasitic resistance and parasitic capacitance generated by the data transmission circuit are reduced. Thereby the data transmission rate and data transmission accuracy performance are improved and power consumption reduce. In addition, the length of the memory block in the memory bank BANK is shortened, which optimizes the layout of the memory bank BANK in the DRAM memory, the ration of length and width of the DRAM memory is more beneficial to later packaging.

To better understand the above-mentioned goals, features and advantages of the present invention, the specific embodiments of the present invention will be described in detail below with reference to the accompanying drawings. When describing the embodiments of the present invention in detail, for illustration convenience, sections of the schematic diagram may be enlarged not proportionally to scale. The exemplary schematic diagram should not limit the scope of the present invention herein. In actual production, the three-dimensions of length, width and depth should be considered.

Figure 2:
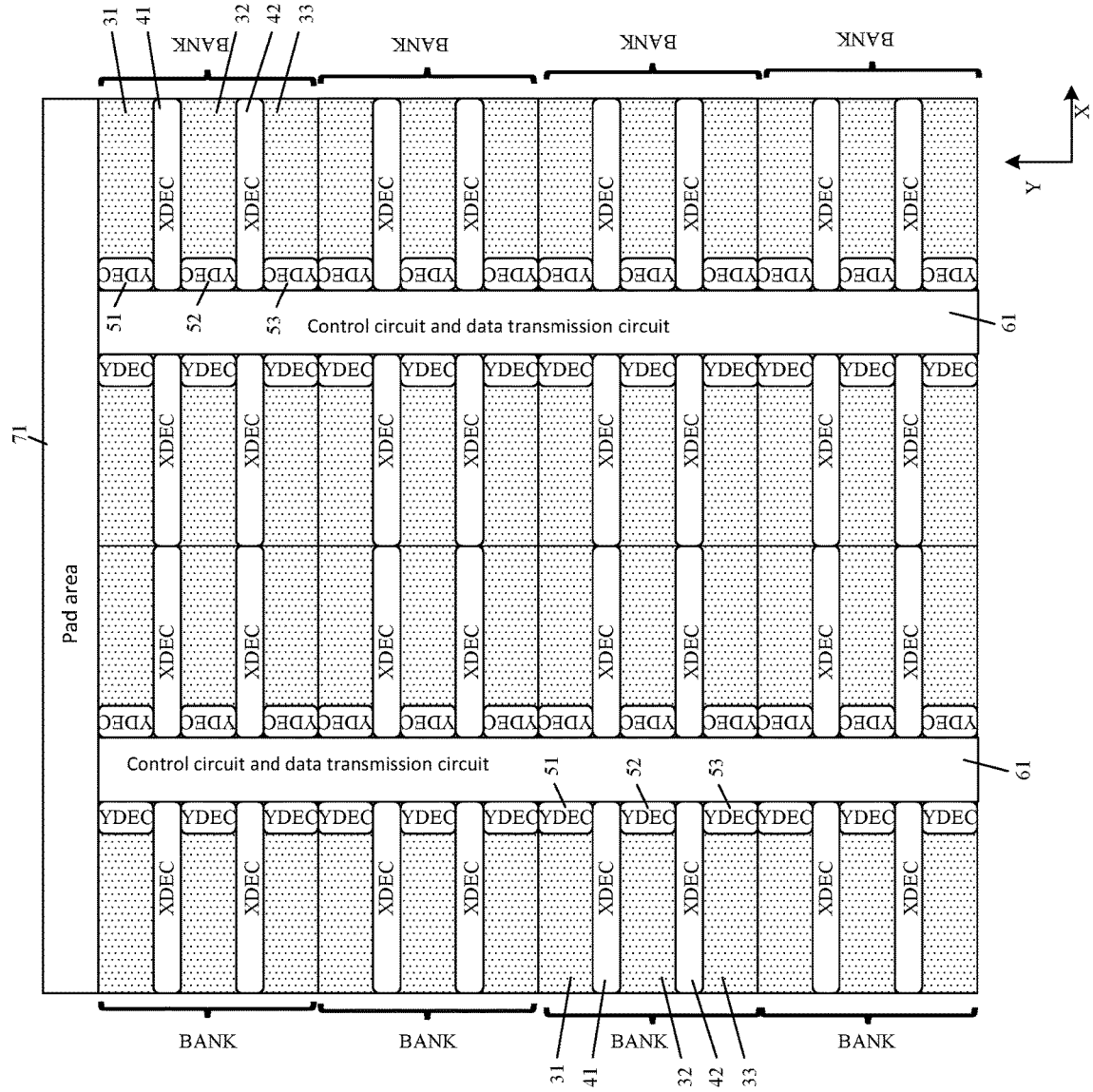
FIG. 2 is a schematic structural diagram of a DRAM memory in another embodiment of the present invention.

FIG. 2 is a schematic structural diagram of a DRAM memory in another embodiment of the present invention.

Referring to FIG. 2, the DRAM memory includes: a substrate (not shown in the figure); a number of memory banks BANK arranged in rows and columns on the substrate, each bank BANK is divided into three memory blocks (31/32/33) in the column direction, and each memory block (31 or 32 or 33) has a number of memory cells arranged in rows and columns.

Generally a DRAM memory is divided into a number of memory banks BANK. The number of memory banks BANK in a DRAM memory can be 4, 8, 16 or other numbers. The memory capacity of each bank BANK is the same, for example, if the DRAM memory capacity is 8 Gb and there are 8 memory banks BANK, the capacity of each bank BANK is 1 Gb. Each bank BANK in the DRAM memory has its own bank address, which is used to access the DRAM memory (such as reading, writing or refreshing). When accessing the memory, first look for the corresponding memory bank BANK, and then find the corresponding memory cell in the memory bank BANK. In FIG. 2, a DRAM memory having 16 BANKs is illustrated as an example.

Each memory bank BANK is divided into three memory blocks in the column direction. Each memory block has a memory array. The memory array includes a number of memory cells arranged in rows and columns. In this example, the three memory blocks includes a first memory block 31, a second memory block 32, and a third memory block 33 arranged sequentially in the column direction. The first memory block 31, the second memory block 32, and the third memory block 33 are respectively connected with the corresponding rows decoding circuit XDEC and the column decoding circuit YDEC (it should be noted that, in this example, the column direction refers to the Y axis direction, and the row direction refers to the X axis direction). First, as the capacity of each memory bank BANK is constant, by dividing each memory bank BANK into three memory blocks (the first memory block 31, the second memory block 32 and the third memory block 33) in the column direction, the length of each memory block in the row direction will be shortened (comparing to dividing each memory bank into two memory blocks in the row direction), the length of the control circuit itself will be shortened, and the distance from the control circuit to the corresponding memory cell in the memory array in each memory block will be shortened, so that a large drive will not be required, therefore power consumption is reduced. The length of the data transmission circuit itself is also shortened, and the distance from the data transmission circuit to the corresponding memory cell in the memory array in each memory block will be shortened too, so that the parasitic resistance and parasitic capacitance generated by the data transmission circuit are reduced. Thereby the data transmission rate and data transmission accuracy performance are improved and power consumption is reduced. In addition, the length of the memory block in the memory bank BANK is shortened, which optimizes the layout of the memory bank BANK in the DRAM memory, the length to width ratio of the DRAM memory is more beneficial to later packaging.

In an embodiment, the memory capacities of the first memory block 31, the second memory block 32, and the third memory block 33 are equal.

In an embodiment, the first memory block 31, the second memory block 32, and the third memory block 33 in each memory bank BANK are respectively connected to the first column decoding circuit (YDEC) 51, the second column decoding circuit (YDEC) 52, and the third column decoding circuit (YDEC) 53. The first memory block 31, the second memory block 32, and the third memory block 33 in each of the memory banks BANK are also connected to the first row decoding circuit (XDEC) 41 and the second row decoding circuit (XDEC) 42. The first column decoding circuit (YDEC) 51, the second column decoding circuit (YDEC) 52 and the third column decoding circuit (YDEC) 53 are respectively used for performing column addressing of the corresponding memory cells of the first memory block 31, the second memory block 32 and the third memory block 33. The first row decoding circuit (XDEC) 41 and the second row decoding circuit (XDEC) 42 are used to perform row addressing of the memory cells in the first memory block 31, the second memory block 32 and the third memory block 33. So it is possible to access simultaneously the corresponding memory cells of the three memory blocks in a memory bank BANK (including reading, writing or refreshing), which improves the operating efficiency of the DRAM memory in the memory bank.

In an embodiment, the first row decoding circuit 41 is connected to all the memory units in the first memory block 31 and some memory cells in the second memory block 32, and is used to perform row addressing to the memory cells in the first memory block 31 and some memory cells in the second memory block 32. The second row decoding circuit 42 and the third memory block 33 are connected for row addressing to all memory cells in the third memory block 33 and some memory cells in the second memory block 32. Therefore, controlling the row decoding (decoding) is shared among the memory cells in the three memory blocks in one memory bank BANK, thereby saving the chip area.

There is a circuit area 61 between the two adjacent columns of memory banks BANK. The circuit area 61 has a control circuit and a data transmission circuit. The control circuit is used to send control instructions and/or addresses to the corresponding memory banks. The control instructions include write instructions, read instructions, and refresh instructions. The addresses include the bank address of each bank BANK and the row address and column address of the corresponding memory cell in the corresponding memory block in the bank BANK. The data transmission circuit is used to transmit data to or read data from the corresponding memory cell in the corresponding memory bank BANK.

The substrate also has a pad area 71. The pad area 71 is generally located around the bank BANK array. The pad area 71 has a plurality of first pad areas and a plurality of second pad areas. The plurality of first pad areas is connected with the control circuit, and the plurality of second pad areas is connected with the data transmission circuit.

In one embodiment, the process of addressing the DRAM memory is generally to first specify the address of the memory bank BANK, then specify the row address, and then specify the column address.

It should be noted that other limitations or descriptions of the memory structure will not be repeated. For more details, please refer to the corresponding limitations or descriptions in the above disclosure.

Although the present invention has been disclosed as above in preferred embodiments, it is not intended to limit the present invention. Any person skilled in the art can use the methods and technical content disclosed above to improve the present invention without departing from the spirit and scope of the present invention. The technical solution makes possible changes and modifications. Therefore, all simple modifications, equivalent changes and modifications made to the above embodiments according to the technical essence of the present invention without departing from the content of the technical solution of the present invention are protected by the present invention.

The exemplary embodiments of the present disclosure are specifically shown and described above. It should be understood that the present disclosure is not limited to the detailed structure, arrangement or implementation method described herein; on the contrary, the present disclosure intends to cover various modifications and equivalent arrangements included in the spirit and scope of the appended claims.

The invention claimed is:

1. A DRAM memory, comprising:
    a substrate;
    a plurality of memory banks arranged in rows and columns on the substrate; and
    a circuit area arranged between two adjacent columns of the plurality of memory banks, wherein the circuit area comprises a control circuit and a data transmission circuit;
        wherein the circuit area of the control circuit and the data transmission circuit has long sides and short sides, wherein the long sides are parallel to the column direction, and the short sides are parallel to the row direction;
        wherein each of the plurality of memory banks at each of the long sides of the circuit area of the control circuit and the data transmission circuit is divided into three memory blocks in a column direction, wherein the three memory blocks are arranged in parallel to each other and configured to be perpendicular to the long sides of the circuit area, and wherein each of the three memory blocks comprises memory cells arranged in rows and columns;
    wherein the control circuit and the data transmission circuit are configured to connect to a corresponding memory cell in each of the three memory blocks; and
    wherein each of the plurality of memory banks comprises two row decoding circuits and three column decoding circuits, wherein both a first and a second row decoding circuits of the two row decoding circuits share a same length which is perpendicular to the long sides of the circuit area, and wherein the three column decoding circuits comprise a first, a second and a third column decoding circuits arranged in each of the three memory blocks respectively.

2. The DRAM memory according to claim 1, wherein the three memory blocks comprise a first memory block, a second memory block, and a third memory block that are sequentially arranged in the column direction.

3. The DRAM memory according to claim 2, wherein the first memory block is connected to the first column decoding circuit, the second memory block is connected to the second column decoding circuit, and the third memory block is connected to the third column decoding circuit.

4. The DRAM memory according to claim 3, wherein the first memory block, the second memory block, and the third memory block in each of the plurality of memory banks are further respectively connected to the first row decoding circuit and the second row decoding circuit.

5. The DRAM memory according to claim 4, wherein the first row decoding circuit is connected to all memory cells in the first memory block and some memory cells in the second memory block for performing row addressing in all memory cells in the first memory block and some memory cells in the second memory block, and wherein the second row decoding circuit is connected to all memory cells in the third memory block and some memory cells in the second memory block for perform row addressing in all memory cells in the third memory block and some memory cells in the second memory block.

6. The DRAM memory according to claim 2, wherein a memory capacity of the first memory block, a memory capacity of the second memory block and a memory capacity of the third memory block are all equal.

7. The DRAM memory according to claim 1, wherein the control circuit sends control instructions and/or addresses to a corresponding one of the plurality of memory banks, and wherein the data transmission circuit transmits data to or reads data from a corresponding memory cell in the corresponding one of the plurality of memory banks.

8. The DRAM memory according to claim 7, further comprising a pad area, wherein the pad area has a plurality of first pads and a plurality of second pads, wherein the plurality of first pads is connected to the control circuit, and wherein the plurality of second pads is connected to the data transmission circuit.

* * * * *